United States Patent
Brunco et al.

(10) Patent No.: US 10,325,811 B2
(45) Date of Patent: Jun. 18, 2019

(54) FIELD-EFFECT TRANSISTORS WITH FINS HAVING INDEPENDENTLY-DIMENSIONED SECTIONS

(71) Applicant: GLOBALFOUNDRIES Inc., Grand Cayman (KY)

(72) Inventors: David P. Brunco, Latham, NY (US); Wei Zhao, Fort Lee, NJ (US); Haiting Wang, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/794,600

(22) Filed: Oct. 26, 2017

(65) Prior Publication Data

US 2019/0131177 A1    May 2, 2019

(51) Int. Cl.
| | |
|---|---|
| H01L 21/02 | (2006.01) |
| H01L 29/06 | (2006.01) |
| H01L 29/66 | (2006.01) |
| H01L 21/306 | (2006.01) |
| H01L 21/311 | (2006.01) |
| H01L 21/762 | (2006.01) |
| H01L 27/088 | (2006.01) |
| H01L 21/8234 | (2006.01) |

(52) U.S. Cl.
CPC ........ *H01L 21/823431* (2013.01); *H01L 21/02233* (2013.01); *H01L 21/02639* (2013.01); *H01L 21/30625* (2013.01); *H01L 21/31144* (2013.01); *H01L 27/0886* (2013.01); *H01L 29/0649* (2013.01); *H01L 29/6653* (2013.01); *H01L 29/6656* (2013.01); *H01L 21/31116* (2013.01); *H01L 21/76224* (2013.01); *H01L 29/66545* (2013.01)

(58) Field of Classification Search
CPC .......... H01L 27/0886; H01L 21/30625; H01L 21/02639; H01L 21/823431; H01L 21/02233; H01L 29/0649; H01L 29/6653; H01L 29/6656; H01L 21/31144; H01L 21/0233
See application file for complete search history.

(56) References Cited

U.S. PATENT DOCUMENTS

| | | | |
|---|---|---|---|
| 6,835,618 B1 | 12/2004 | Dakshina-Murthy et al. | |
| 6,909,147 B2 * | 6/2005 | Aller ................. | H01L 21/84 257/347 |
| 7,544,994 B2 * | 6/2009 | Schepis ............. | H01L 21/845 257/302 |
| 7,612,405 B2 * | 11/2009 | Yu .................... | H01L 21/823431 257/328 |

(Continued)

*Primary Examiner* — Jarrett J Stark
*Assistant Examiner* — Charles N Ausar-El
(74) *Attorney, Agent, or Firm* — Thompson Hine LLP; Francois Pagette

(57) ABSTRACT

Methods of forming a structure for a fin-type field-effect transistor and structures for a fin-type field-effect transistor. A plurality of sacrificial layers are formed on a dielectric layer. An opening is formed that includes a first section that extends through the sacrificial layers and a second section that extends through the dielectric layer. A semiconductor material is epitaxially grown inside the opening to form a fin. The first section of the opening has a first width dimension, and the second section of the opening has a second width dimension that is less than the first width dimension.

17 Claims, 3 Drawing Sheets

(56) References Cited

U.S. PATENT DOCUMENTS

| | | | |
|---|---|---|---|
| 8,828,839 B2 | 9/2014 | Brunco et al. | |
| 9,324,868 B2* | 4/2016 | Yan | H01L 29/7853 |
| 9,437,504 B2 | 9/2016 | Loubet et al. | |
| 9,553,194 B1* | 1/2017 | Licausi | H01L 29/7853 |
| 9,583,625 B2* | 2/2017 | Wu | H01L 29/7851 |
| 9,704,973 B2* | 7/2017 | Xie | H01L 29/66795 |
| 9,716,174 B2* | 7/2017 | Akarvardar | H01L 29/785 |
| 9,773,893 B1* | 9/2017 | Bu | H01L 29/66818 |
| 9,779,944 B1* | 10/2017 | Burns | H01L 21/31144 |
| 9,831,132 B2* | 11/2017 | Park | H01L 21/823821 |
| 9,842,931 B1* | 12/2017 | Anderson | H01L 29/785 |
| 9,887,196 B2* | 2/2018 | Cai | H01L 27/0922 |
| 9,991,165 B1* | 6/2018 | Huang | H01L 21/823418 |
| 10,068,766 B2* | 9/2018 | Zang | H01L 21/0337 |
| 10,084,092 B2* | 9/2018 | Zhou | H01L 21/02126 |
| 2004/0262687 A1* | 12/2004 | Jung | H01L 21/84 257/347 |
| 2008/0128797 A1* | 6/2008 | Dyer | H01L 29/66795 257/328 |
| 2012/0040528 A1* | 2/2012 | Kim | H01L 21/76816 438/675 |
| 2014/0353767 A1* | 12/2014 | Liu | H01L 21/845 257/401 |
| 2015/0024573 A1 | 1/2015 | Jacob et al. | |
| 2017/0005165 A1* | 1/2017 | Chen | H01L 29/785 |
| 2017/0194323 A1* | 7/2017 | Liaw | H01L 21/823431 |
| 2017/0194325 A1* | 7/2017 | Ando | H01L 27/0886 |
| 2018/0090493 A1* | 3/2018 | Kwak | H01L 29/66795 |

\* cited by examiner

FIELD-EFFECT TRANSISTORS WITH FINS HAVING INDEPENDENTLY-DIMENSIONED SECTIONS

BACKGROUND

The present invention relates to semiconductor device fabrication and integrated circuits and, more specifically, to methods of forming a structure for a fin-type field-effect transistor and structures for a fin-type field-effect transistor.

Device structures for a field-effect transistor generally include a body region, a source and a drain defined in the body region, and a gate electrode configured to switch carrier flow in a channel formed in the body region. When a control voltage exceeding a designated threshold voltage is applied to the gate electrode, carrier flow occurs in an inversion or depletion layer in the channel between the source and drain to produce a device output current. The body region and channel of a planar field-effect transistor are located beneath the top surface of a substrate on which the gate electrode is supported.

A fin-type field-effect transistor (FinFET) is a non-planar device structure that may be more densely packed in an integrated circuit than planar field-effect transistors. A FinFET may include a fin consisting of a solid unitary body of semiconductor material, heavily-doped source/drain regions formed in sections of the body, and a gate electrode that wraps about a channel located in the fin body between the source/drain regions. The arrangement between the gate structure and fin body improves control over the channel and reduces the leakage current when the FinFET is in its 'Off' state in comparison with planar transistors. This, in turn, enables the use of lower threshold voltages than in planar transistors, and results in improved performance and lowered power consumption.

In conventional constructions for a FinFET, trench isolation is formed that encapsulates a lower portion of the fins. The upper portion of the fins, which are revealed above the trench isolation, represent active regions used as the channel. In a replacement gate process, the active regions of the fins may be lightly oxidized to form a thin layer of a silicon oxide on their exterior surfaces. The oxidation process consumes a thin layer of the semiconductor material, which narrows the width of the upper portions. The result is that the upper portions of the fins are narrower than the lower portions of the fins, which are encapsulated in the trench isolation during the oxidation process.

SUMMARY

In an embodiment, a method includes forming a plurality of sacrificial layers on a dielectric layer, forming an opening with a first section that extends through the sacrificial layers and a second section that extends through the dielectric layer, and epitaxially growing a semiconductor material inside the opening to form a fin. The first section of the opening has a first width dimension, and the second section of the opening has a second width dimension that is less than the first width dimension.

In an embodiment, a structure includes a dielectric layer with a top surface, and a fin having a first section arranged above the top surface of the dielectric layer and a second section arranged below the top surface of the dielectric layer. The first section of the fin has a first width dimension, and the second section of the fin has a second width dimension that is less than or equal to the first width dimension.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
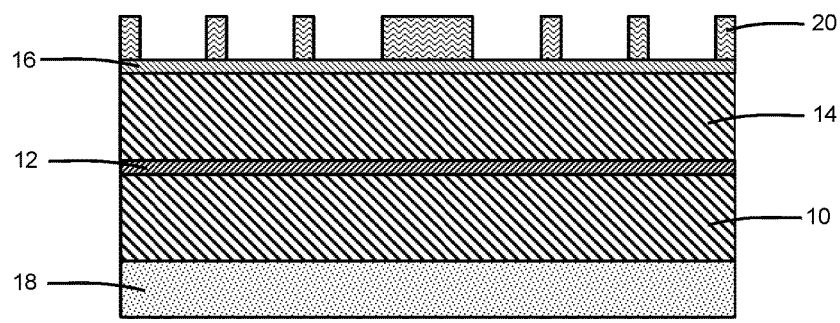
FIGS. 1-8 are cross-sectional views of a device structure at successive fabrication stages of a processing method in accordance with embodiments of the invention.

With reference to FIG. 1 and in accordance with embodiments of the invention, multiple dielectric layers 10, 12, 14, 16 are vertically arranged in a layer stack on a substrate 18. The dielectric layers 12 and 16 may be composed of one or more dielectric materials that are selected to etch selective to one or more dielectric materials of the dielectric layers 10 and 14. In an embodiment, the dielectric layers 10 and 14 may be composed of the same dielectric material, and the dielectric layers 12 and 16 may also be composed of the same dielectric material and may be thinner than dielectric layers 10 and 14. In an embodiment, the dielectric layers 10 and 14 may be composed of silicon dioxide ($SiO_2$) where dielectric layer 10 is either formed by thermal oxidation of the substrate 18 or deposited by chemical vapor deposition (CVD) and dielectric layer 14 is deposited by CVD. In an embodiment, the dielectric layers 12 and 16 may be composed of silicon nitride ($Si_3N_4$) deposited by CVD and that exhibits etch selectivity relative to silicon dioxide. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The substrate 18 may be composed of single crystal semiconductor material, such as single crystal silicon or a III-V semiconductor material, or may be a semiconducting heterostructure like silicon-on-insulator or SiGe on Si. A hardmask 20 is arranged on and over the top surface of dielectric layer 16, and may be composed of a material (or multiple layers of different materials) that etches selective to the materials of the dielectric layers 10, 12, 14, 16. The hardmask 20, which is image inversed, may be patterned using, for example, self-aligned double patterning (SADP), self-aligned quadruple patterning (SAQP), or EUV lithography.

Figure 2:
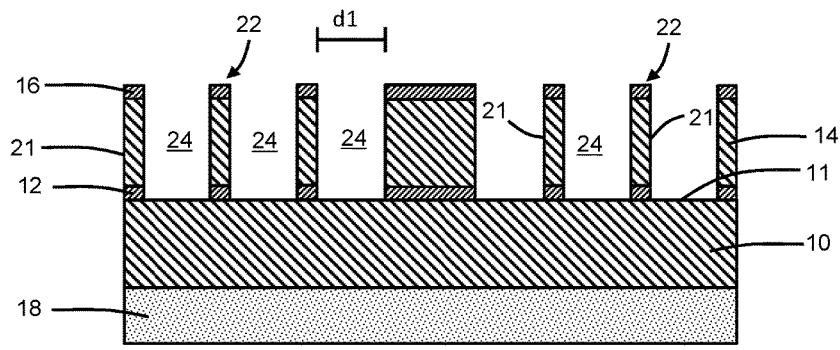

With reference to FIG. 2 in which like reference numerals refer to like features in FIG. 1 and at a subsequent fabrication stage, sacrificial structures 22 are formed by etching the dielectric layers 12, 14, 16 with an anisotropic etching process using the hardmask 20 as an etch mask. The anisotropic etching process, such as a reactive-ion etching (ME), may be conducted in a single etching step or multiple etching steps with different etch chemistries. The etch chemistry for the anisotropic etching process that penetrates through the bottommost dielectric layer 12 is selected to stop on the material of the dielectric layer 10. Openings 24 of width dimension d1 are formed by the anisotropic etching process in the dielectric layers 12, 14, 16 over areas that are not masked by the hardmask 20. The openings 24 are arranged between the vertical sidewalls 21 of adjacent pairs of the sacrificial structures 22. The width dimension may be measured as the perpendicular distance between the vertical sidewalls 21. The hardmask 20 may be stripped after acting as the etch mask during the formation of the sacrificial structures 22.

Figure 3:
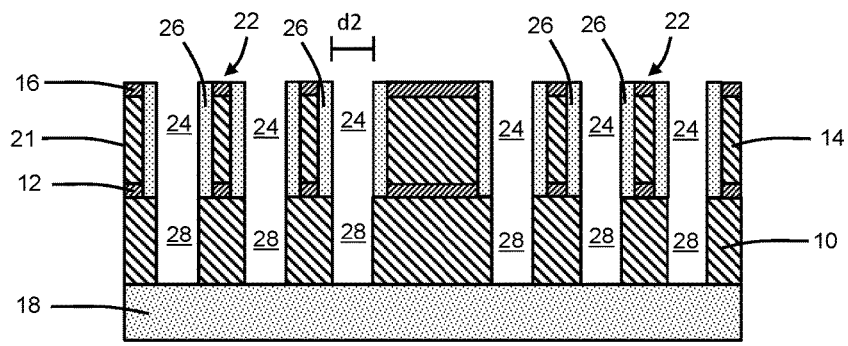

With reference to FIG. 3 in which like reference numerals refer to like features in FIG. 2 and at a subsequent fabrication stage, sidewall spacers 26 are formed on a top surface 11 of the dielectric layer 10 at locations adjacent to the vertical sidewalls 21 of each sacrificial structure 22. The sidewall spacers 26 may be composed of a sacrificial material, such as carbon-doped silicon (SiC), silicon carbonitride (SiCN), aluminum oxide ($Al_2O_3$), or hafnium oxide ($HfO_2$). The sidewall spacers 26 may be formed by depositing a conformal layer composed of the sacrificial material with atomic layer deposition (ALD) and etching with a directional etching process, such as reactive ion etching (RIE). The sidewall spacers 26 increase the effective width of the sacrificial structures 22 above and beyond their original width.

An anisotropic etching process, such as RIE, is performed to etch through the dielectric layer 10 to the top surface of the substrate 18 with the spacer-clad sacrificial structures 22 operating as an etch mask. Openings 28 of width dimension d2 are formed in the dielectric layer 10 over areas not masked by the spacer-clad sacrificial structures 22. Each of the openings 28 is aligned and centered with one of the openings 24. The increase in the effective width of the sacrificial structures 22, due to the additional of sidewall spacers 26, results in the width dimension of the openings 28 in dielectric layer 10 being less than the width dimension of the openings 24 prior to the formation of the sidewall spacers 26.

Figure 4:
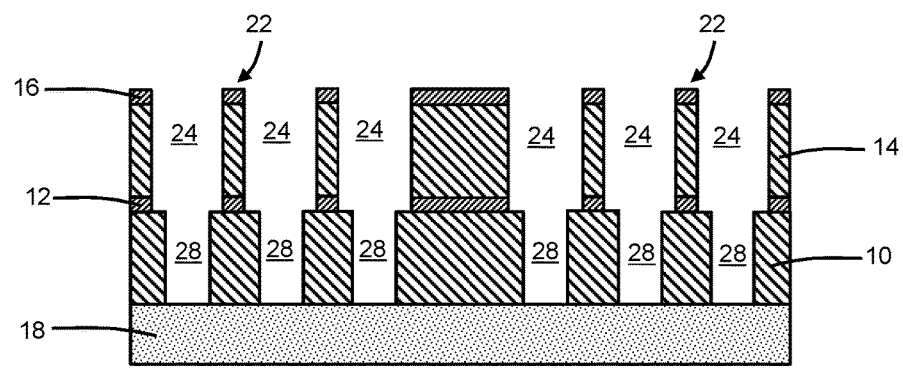

With reference to FIG. 4 in which like reference numerals refer to like features in FIG. 3 and at a subsequent fabrication stage, the sidewall spacers 26 are removed from the vertical sidewalls 21 of the sacrificial structures 22 with an etching process. The removal of the sidewall spacers 26 restores the width dimension d1 to the openings 24, but does not change the width dimension d2 of the openings 28 in the dielectric layer 10. The width dimension of the openings 24 between the sacrificial structures 22 is greater than the width dimension of the openings 28 (i.e., the openings 24 are wider than openings 28) after removal of the sidewall spacers 26.

Figure 5:
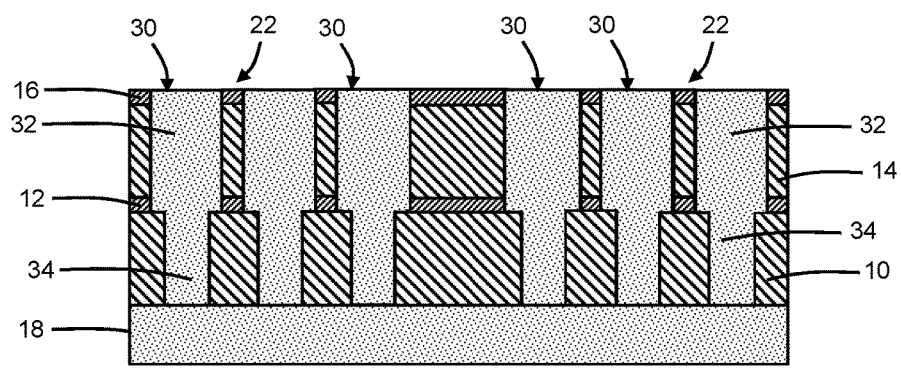

With reference to FIG. 5 in which like reference numerals refer to like features in FIG. 4 and at a subsequent fabrication stage, dual-width fins 30 composed of a semiconductor material are formed in the composite openings 24, 28. The semiconductor material of the dual-width fins 30 may be formed using an epitaxial growth process in which the single crystal semiconductor material of the substrate 18 provides the crystal structure that serves as a template or growth seed for the epitaxial growth process. In an embodiment, the dual-width fins 30 may be formed by a selective epitaxial growth (SEG) process in which semiconductor material nucleates for epitaxial growth on semiconductor surfaces (e.g., the substrate 18), but does not nucleate for epitaxial growth from insulator surfaces (e.g., the sacrificial structures 22 and the dielectric layer 10). In an embodiment, the dual-width fins 30 may be composed of single crystal silicon that has an epitaxial relationship with the substrate 18. The composite openings 24, 28 may be overfilled by the semiconductor material, which may be planarized following epitaxial growth relative to the dielectric layer 16 using a chemical-mechanical polishing (CMP) process.

The epitaxial growth is constrained spatially by the dimensions of the openings 24, 28, and the semiconductor material of each dual-width fin 30 adopts the composite shape of an adjoined pair of openings 24, 28 resulting in the dual-width shape. The sections 32 are wider than the sections 34. Specifically, each of the dual-width fins 30 has a section 32 with a width dimension equal to the width dimension d1 and a section 34 with a width dimension equal to the width dimension d2 that is arranged vertically between the section 32 and the substrate 18.

Figure 6:
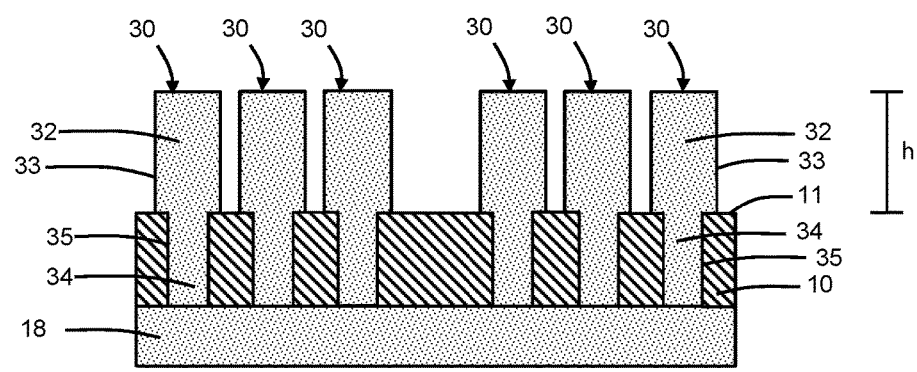

With reference to FIG. 6 in which like reference numerals refer to like features in FIG. 5 and at a subsequent fabrication stage, the sacrificial structures 22 are removed selective to the fins 30 with an etching process. The etching process may be conducted in a single etching step or multiple etching steps with different etch chemistries selected to remove the dielectric layers 12, 14, 16 of the sacrificial structures 22. The etch chemistry for the etching process that penetrates through the bottommost dielectric layer 12 is selected to stop on the material of the dielectric layer 10. The sections 32 of the fins 30 are revealed by the etching process, and represent active regions (i.e., channel regions or source/drain regions) of the fins 30. The sections 32 of the fins 30 have equal heights relative to the top surface 11 of dielectric layer 10 because of the manner in which the openings 24 are formed relying on the dielectric layer 10 as an etch stop.

Each of the sections 32 has vertical sidewalls 33 that are parallel and a rectangular shape, and each of the sections 34 also has vertical sidewalls 35 that are parallel and a rectangular shape. Due to the constraint imposed during epitaxial growth that provides the vertical sidewalls 33, 35 and because the fins 30 are not patterned, the sections 32, 34 do not have a tapered or truncated-triangular shape characterized by non-vertical sidewalls as produced conventionally. At and above the top surface of the dielectric layer 10, the sections 32 are wider than the sections 34, which contrasts with conventional fins in which this relationship is reversed.

Figure 7:
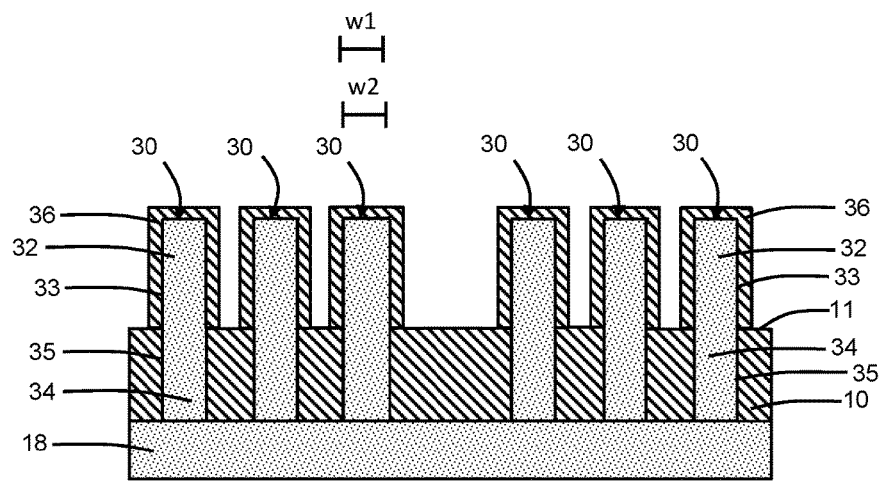

With reference to FIG. 7 in which like reference numerals refer to like features in FIG. 6 and at a subsequent fabrication stage, the sections 32 of the fins 30 may be trimmed by performing an optional trim process that narrows a width dimension of the sections 32 to a numerical value that is less than the initial width dimension d1. The trim process may include, for example, a trim etch, a sacrificial oxidation, and/or smoothing. The trim etch may include, for example, a reactive ion etch or a low ion energy plasma process (e.g., using a Cl based chemistry). The sacrificial oxidation may include, for example, oxidizing aqueous chemistries (e.g., ozonated water) or thermal processing in an oxidizing ambient (e.g., $O_2$, $O_3$, steam, oxygen radicals, or oxygen-containing ions) to form an oxide followed by removal of the oxide using, for example an aqueous solution containing hydrofluoric acid or dry methods. The smoothing process may include, for example, thermal processing in an environment that enhances the surface mobility of the semiconductor material (e.g., thermal anneals in low pressure $H_2$).

An oxide layer 36 may be formed, after trimming, on the sidewalls 33 and top surface of the sections 32 of the fins 30. The oxide layer 36 may be formed using, for example, oxidizing aqueous chemistries (e.g., ozonated water) or thermal processing in an oxidizing ambient (e.g., $O_2$, $O_3$, steam, oxygen radicals, or oxygen-containing ions). Generally, the formation of the oxide layer 36 consumes an outer surface layer of the semiconductor material at the exposed exterior surfaces of the sections 32 of the fins 30, and may narrows a width dimension of the sections 32 to a value less than the initial width dimension. For embodiments in which the fins 30 are composed of silicon and the oxide in the oxide layer 36 is silicon dioxide, the thickness of the consumed silicon is approximately 46% of the thickness of the formed silicon dioxide.

Following trimming/smoothing and/or the formation of the oxide layer that reduced the width dimension of the sections 32 of the fins 30 that are located above the top surface of the dielectric layer 10, the sections 32 have a width dimension, w1. The sections 34 of the fins 32 that are located below the top surface of the dielectric layer 10 have a width dimension, w2. In an embodiment, the width, w2, of the sections 34 may be less than or equal to the width dimension, w1, of the sections 32 of the fins 30. These sections 34 are unaffected by the trimming/smoothing and/or the formation of the oxide layer 36. In the representative embodiment, the width dimension of the sections 32 is equal to the width dimension of the sections 34. The critical width dimensions of the sections 32, 34 may be controlled independent of each other due to the manner in which the sections 32 are formed.

In a conventional structure in which fins are covered by a similar oxide layer and/or trimmed, the width dimension of the buried sections beneath the top surface of the dielectric layer is greater than the width dimension of the revealed sections above the top surface of the dielectric layer, which is the converse of the relative width dimensions of the sections 32 and 34 of fins 30. The oxidation process and/or trimming increases this width difference.

After formation of the oxide layer 36, the sidewalls 33 of the sections 32 and the sidewalls 35 of the sections 34 are respective vertically-oriented surfaces that are planar and that may be coplanar if the widths of the sections 32 and the sections 34 are equal. The patterning forming the sacrificial structures 22 may be controlled to provide an initial width dimension of the openings 24 and thereby tailor the initial width dimension of the sections 32 so as to compensate for thinning due to the trimming process and/or the formation of the thin oxide layer 36, and to provide a final width dimension for the sections 32 that is greater than or equal to the width dimension of the sections 34.

Figure 8:
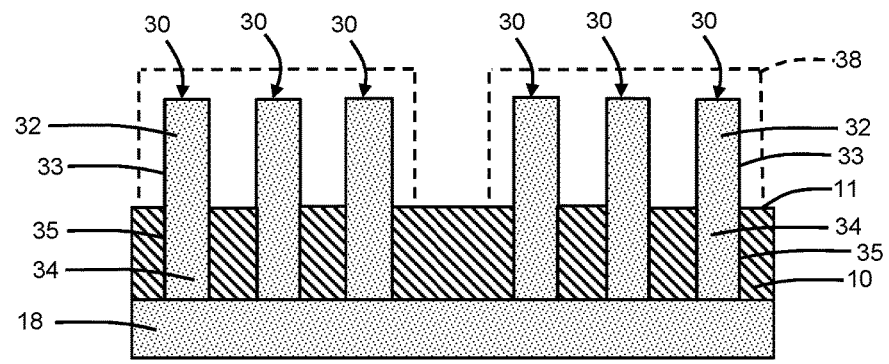

With reference to FIG. 8 in which like reference numerals refer to like features in FIG. 7 and at a subsequent fabrication stage, the oxide layer 36 may be removed from the fins 30. The sidewalls 33 of the sections 32 of the fins 30 are re-exposed after the removal of the oxide layer 36. A gate structure 38 of a field-effect transistor may be formed that overlaps with a channel region in each of the fins 30. Source and drain regions (not shown) may be formed in and/or on the fins 30 that flank the gate structure 38. The gate structure 38 may be formed as part of a replacement metal gate process that removes a polysilicon dummy gate structure formed on the thin oxide layer 36 and replaces it. The gate structure 38 may include a gate electrode and a gate dielectric interposed between the gate electrode and each channel region. The gate electrode may one or more conformal barrier metal layers and/or work function metal layers, such as layers composed of titanium aluminum carbide (TiAlC) and/or titanium nitride (TiN), and a metal gate fill layer composed of a conductor, such as tungsten (W). The gate dielectric may be composed of a dielectric material, such as a high-k dielectric material like hafnium oxide ($HfO_2$). The source and drain regions may be doped with a dopant, such as a Group V dopant like arsenic (As) or phosphorous (P) for n-type conductivity or a Group III dopant like boron (B) for p-type conductivity, that is diffused from heavily-doped semiconductor material that is grown from the source and drain regions of the fins 30.

The fins 30 may be used to construct n-type field-effect transistors, p-type field-effect transistors, or a CMOS device (e.g., some fins 30 are used to construct an field-effect transistor and other fins 30 are used to construct a p-type field-effect transistor). The sections 34 of the fins 30 are embedded in the dielectric layer 10, which furnishes trench isolation. The trench isolation is formed in the processing sequence before the fins 30 are formed.

Middle-of-line (MOL) processing and back-end-of-line (BEOL) processing follow, which includes formation of contacts, via plugs, and wiring of an interconnect structure connected with the field-effect transistor.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a plurality of sacrificial layers on a dielectric layer;
   patterning the sacrificial layers with a first etching process to form a first section of an opening that extends through the sacrificial layers;
   after forming the first section of the opening, forming a plurality of spacers on the sacrificial layers inside the opening;

after forming the spacers, forming a second section of the opening that extends through the dielectric layer; and after forming the second section of the opening, epitaxially growing a semiconductor material inside the first section of the opening and the second section of the opening to form a fin, wherein the first section of the opening has a first width dimension, and the second section of the opening has a second width dimension that is less than the first width dimension.

2. The method of claim 1 wherein an etch chemistry of the first etching process is selected to stop on a top surface of the dielectric layer.

3. The method of claim 1 wherein forming the second section of the opening that extends through the dielectric layer further comprises:

patterning the dielectric layer with a second etching process to form the second section of the opening.

4. The method of claim 3 further comprising:

removing the spacers before the semiconductor material is epitaxially grown inside the first section of the opening and the second section of the opening to form the fin.

5. The method of claim 1 wherein the dielectric layer is formed on a single crystal semiconductor substrate, the second section of the opening extends through the dielectric layer to a portion of the single crystal semiconductor substrate, and the portion of the single crystal semiconductor substrate is a seed for the epitaxial growth of the semiconductor material inside the opening to form the fin.

6. The method of claim 1 wherein the fin has a first section of the first width dimension inside the first section of the opening and a second section of the second width dimension inside the second section of the opening, and further comprising:

forming an oxide layer on the first section of the fin with an oxidation process, wherein the first width dimension of the first section of the fin is reduced by formation of the oxide layer.

7. The method of claim 6 wherein the reduced first width dimension of the first section of the fin is equal to the second width dimension of the second section of the fin.

8. The method of claim 6 further comprising:

removing the oxide layer from the first section of the fin.

9. The method of claim 6 wherein the second section of the fin is encapsulated in the dielectric layer during the oxidation process.

10. A method comprising:

forming a first sacrificial layer over a dielectric layer and a second sacrificial layer on the first sacrificial layer;

forming an opening with a first section that extends through the first sacrificial layer and the second sacrificial layer and a second section that extends through the dielectric layer;

epitaxially growing a semiconductor material inside the first section of the opening and the second section of the opening to form a fin;

after epitaxially growing the semiconductor material, polishing the semiconductor material with the second sacrificial layer providing a polish stop;

after polishing the semiconductor material, removing the second sacrificial layer selective to the first sacrificial layer; and after removing the second sacrificial layer, removing the first sacrificial layer, wherein the first section of the opening has a first width dimension, and the second section of the opening has a second width dimension that is less than the first width dimension.

11. The method of claim 10 wherein the first sacrificial layer is removed selective to the dielectric layer.

12. The method of claim 10 wherein a third sacrificial layer is arranged between the first sacrificial layer and the dielectric layer, the opening includes a third section extending through the third sacrificial layer, the semiconductor material is epitaxially grown inside the third section of the opening, the first sacrificial layer is removed selective to the third sacrificial layer, and further comprising:

after removing the second sacrificial layer, removing the third sacrificial layer selective to the dielectric layer.

13. The method of claim 10 wherein the dielectric layer is formed on a single crystal semiconductor substrate, the second section of the opening extends through the dielectric layer to a portion of the single crystal semiconductor substrate, and the portion of the single crystal semiconductor substrate is a seed for the epitaxial growth of the semiconductor material inside the opening to form the fin.

14. The method of claim 10 wherein the fin has a first section of the first width dimension inside the first section of the opening and a second section of the second width dimension inside the second section of the opening, and further comprising:

forming an oxide layer on the first section of the fin with an oxidation process, wherein the first width dimension of the first section of the fin is reduced by formation of the oxide layer.

15. The method of claim 14 wherein the reduced first width dimension of the first section of the fin is equal to the second width dimension of the second section of the fin.

16. The method of claim 14 further comprising:

removing the oxide layer from the first section of the fin.

17. The method of claim 14 wherein the second section of the fin is encapsulated in the dielectric layer during the oxidation process.

* * * * *